(12) United States Patent
Tsuda et al.

(10) Patent No.: US 6,807,124 B2
(45) Date of Patent: Oct. 19, 2004

(54) MEMORY DEVICE FOR ACTIVATING ONE CELL BY SPECIFYING BLOCK AND MEMORY CELL IN THE BLOCK

(75) Inventors: Nobuhiro Tsuda, Tokyo (JP); Koji Nii, Tokyo (JP); Shoji Okuda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/347,434

(22) Filed: Jan. 21, 2003

(65) Prior Publication Data

US 2004/0008564 A1 Jan. 15, 2004

(30) Foreign Application Priority Data

Jul. 15, 2002 (JP) ........................................ 2002-205172

(51) Int. Cl.[7] .............................................. G11C 8/00
(52) U.S. Cl. ............................ 365/230.03; 365/189.05; 365/189.01
(58) Field of Search ....................... 365/230.03, 189.05, 365/189.01, 51, 189.02, 190

(56) References Cited

U.S. PATENT DOCUMENTS 6,345,010 B1 * 2/2002 Shimazaki et al. .... 365/230.03
6,452,851 B1 * 9/2002 Endo et al. .................. 365/205

FOREIGN PATENT DOCUMENTS

JP         8-96579         4/1996

* cited by examiner

*Primary Examiner*—David Lam
(74) *Attorney, Agent, or Firm*—Oblon, Spivak, McClelland, Maier & Neustadt, P.C.

(57) ABSTRACT

A memory device that consumes no wasteful power in selecting memory cells and achieves high operating speed and size and cost reductions, is provided. In reading of memory cell information, only a single memory cell in a single local block is activated through a read word line. Specifically, AND circuits are provided in correspondence with all memory cells. Each AND circuit receives as its inputs a block select signal for selecting one of the local blocks and an in-block memory cell select signal for selecting one of the memory cells in each local block in a common manner among the local blocks. The outputs from the AND circuits are applied to read word lines. Unselected memory cells are not activated and therefore no current flows from those memory cells to local read bit lines, thereby preventing wasteful power consumption.

4 Claims, 5 Drawing Sheets

US 6,807,124 B2

MEMORY DEVICE FOR ACTIVATING ONE CELL BY SPECIFYING BLOCK AND MEMORY CELL IN THE BLOCK

BACKGROUND OF THE INVENTION

1. Field of the Invention

The present invention relates to memory devices, and more particularly to a memory device having a plurality of memory cells for storing multi-valued (e.g. binary) information.

2. Description of the Background Art

Memory devices having a plurality of memory cells for storing, e.g., binary information include SRAM (Static Random Access Memory).

FIG. 4 shows an example of structure of an SRAM memory array. As shown in FIG. 4, this SRAM memory array includes a plurality of memory cells MC successively arranged in a line. A write bit line WBL, an inverted data write bit line /WBL, and a read bit line RBL are connected to each memory cell MC. In this specification, the symbol "/" denotes logically inverted signal (the same applies hereinafter).

Each memory cell MC is disposed between the write bit line WBL and the inverted data write bit line /WBL and read bit line RBL. As well as these bit lines, read word lines and write word lines are also connected to the memory cells MC (neither is shown in FIG. 4).

In the SRAM memory array shown in FIG. 4, the bit lines for carrying write data or read data and the word lines for selecting memory cells are provided for writing and for reading, respectively. Thus this SRAM memory array is of multiport type which allows write and read operations to be simultaneously performed in the same clock cycle.

Input data DI is provided to the write bit line WBL and the inverted data write bit line /WBL through a write driver 1 for driving both write bit lines. More specifically, the input data DI is given to the write bit line WBL through an inverter I1 in the write driver 1. Also, the input data DI is given to the inverted data write bit line /WBL through a series connection of inverters I2 and I3 in the write driver 1.

On the other hand, output data DO is outputted from the read bit line RBL through an inverter I4 as a read driver for driving data output line.

FIG. 5 shows an example of the structure of the SRAM circuit in the memory cell MC shown in FIG. 4. As shown in FIG. 5, this memory cell MC includes a latch circuit formed of inverters MI1 and MI2 each having its input connected to the other's output, an N-channel MOS transistor MN1 having its source connected to the output of the inverter MI2, and an N-channel MOS transistor MN2 having its source connected to the output of the inverter MI1.

The write bit line WBL is connected to the drain of the N-channel MOS transistor MN1 and the inverted data write bit line /WBL is connected to the drain of the N-channel MOS transistor MN2. The write word line WWL is connected to the gates of the N-channel MOS transistors MN1 and MN2 in common.

The memory cell MC also includes an inverter MI3 connected to the source of the N-channel MOS transistor MN1, for reading data from the latch circuit. The output of the inverter MI3 is connected to the source of an N-channel MOS transistor MN3. The read bit line RBL is connected to the drain of the N-channel MOS transistor MN3 and the read word line RWL is connected to its gate.

The memory cell MC is thus formed with a plurality of inverters and transistors.

Now, in the SRAM memory array shown in FIG. 4, the N-channel MOS transistor MN1 in each memory cell MC is connected to the write bit line WBL, the N-channel MOS transistor MN2 in each memory cell MC is connected to the inverted data write bit line /WBL, and the N-channel MOS transistor MN3 in each memory cell MC is connected to the read bit line RBL.

In general, parasitic capacitance is present in MOS transistors. Accordingly, when driving at least one of the write bit line WBL, inverted data write bit line /WBL and read bit line RBL that are respectively connected to the drains of the N-channel MOS transistors MN1 to MN3, the bit line is loaded with the drain-substrate capacitances of the MOS transistors in the individual memory cells MC.

Therefore, in order to reduce the load capacitance, all memory cells in the memory device are divided into a plurality of local blocks. In other words, some memory cells are grouped into a block and a plurality of blocks are combined to form a memory device. FIG. 6 is a diagram showing an example of the structure of an SRAM memory array divided into blocks.

As shown in FIG. 6, local blocks LB0 to LBm (m is a positive number), each including some memory cells MC, are successively arranged in a line. A global write bit line GWBL and a global read bit line GRBL are connected to the local blocks LB0 to LBm in common. The local blocks LB0 to LBm are disposed between the global write bit line GWBL and the global read bit line GRBL.

The global write bit line GWBL receives input data DI and the global read bit line GRBL outputs output data DO through an inverter I4 as a read driver for driving data output line.

In each of the local blocks LB0 to LBm, a plurality of memory cells MC are successively arranged in a line. In the mth block, a local write bit line LWBLm, a local inverted data write bit line /LWBLm, and a local read bit line LRBLm are connected to each memory cell MC.

In the mth block, the memory cells MC are disposed between the local write bit line LWBLm, and the local inverted data write bit line /LWBLm and local read bit line LRBLm. In addition to these lines, local read word lines and local write word lines (neither is shown in FIG. 6) are also connected to the memory cells MC.

In the mth block, the local write bit line LWBLm and the local inverted data write bit line /LWBLm are supplied with the input data DI from the global write bit line GWBL through a local write driver 1m for driving both write bit lines. More specifically, the input data DI is given to the local write bit line LWBLm through an inverter I1m in the local write driver 1m. Also, the input data DI is given to the local inverted data write bit line /LWBLm through a series connection of inverters I2m and I3m in the local write driver 1m.

A write selector SWm is provided between the global write bit line GWBL and the write driver 1m. The write selector SWm is a switch circuit for providing the input data DI applied to the global write bit line GWBL to a proper block. For example, the write selector SWm is formed as an AND circuit whose one input end is connected to the global write bit line GWBL and whose other input end receives a write block select signal BWm.

On the other hand, the local read bit line LRBLm is connected to the global read bit line GRBL through a read selector SRm. The read selector SRm, too, is a switch circuit, which gives stored data from a proper block to the global read bit line GRBL. For example, the read selector SRm, too, is formed as an AND circuit whose one input end is connected to the local read bit line LRBLm and whose other input end receives a read block select signal BRm.

While the structure of the mth block has been described above, the 0th and other blocks are constructed in the same way.

When the memory cells are divided into blocks as shown above, the drain-substrate capacitances of MOS transistors in the memory cells MC are applied as load only to the local write bit line LWBLm, the local inverted data write bit line /LWBLm, and the local read bit line LRBLm provided in the block to which those memory cells MC belong. Accordingly, when the memory arrays in FIGS. 4 and 6 have the same number of memory cells MC in total and the individual blocks in FIG. 6 include the same number of memory cells MC, the local write bit line LWBLm, the local inverted data write bit line /LWBLm, and the local read bit line LRBLm in FIG. 6 are subjected to a load capacitance that is $1/(m+1)$ of the load capacitance to the write bit line WBL, the inverted data write bit line/WBL, and the read bit line RBL in FIG. 4.

Reducing the load capacitance to each bit line suppresses interconnection delay, and therefore dividing the memory cells into blocks as shown above speeds up write and read operations to and from the memory cells MC.

While FIG. 6 does not show local read word lines and local write word lines to the memory cells MC in the individual blocks, one memory cell MC in the memory device may be selected as shown below in writing or reading of information.

Specifically, the memory cells MC are grouped so that the individual local blocks LB0 to LBm include the same number of memory cells MC and an in-block memory cell select signal is generated to select one memory cell MC in each block in a common manner among the individual local blocks. A local block is selected by using the write block select signal BWm or the read block select signal BRm. For example, such a technique is described in Japanese Patent Application Laid-Open No. 8-96579 (1996): the signal shown as numerical number 14 in FIG. 1 in the specification corresponds to the in-block memory cell select signal and the signal shown as numerical number 15 corresponds to the read block select signal BRm.

However, when one memory cell MC is selected in common in each local block, one memory cell MC is activated in each local block, which consumes wasteful power. That is, in FIG. 6, for example, when the read word line RWL in one memory cell MC is activated in each of the local blocks LB0 to LBm, currents flow from the inverters MI3 in those memory cells MC to the individual local read bit lines LRBL0 to LRBLm in the individual local blocks LB0 to LBm. This means that current flows to the local read bit lines in unselected local blocks, consuming wasteful power.

Also, when the memory cells are divided into blocks as shown in FIG. 6, each block requires circuits as interfaces between the local and global write bit lines and between the local and global read bit lines (in FIG. 6, the local write driver 1m, the write selector SWm, and the read selector SRm). Providing such an increased number of interface circuits increases the chip area, which hinders size reduction and cost reduction of the memory device.

Write and read operations of the memory device can be speeded up by reducing the number of memory cells included in each block, but reducing the number of memory cells in each block while maintaining the storage capacity inevitably requires increasing the number of blocks. Increasing the number of blocks means increasing the number of interface circuits. Thus the speeding up of the memory device has been in a trade-off relation with the size reduction and cost reduction.

SUMMARY OF THE INVENTION

An object of the present invention is to provide a memory device that consumes no wasteful power when selecting memory cells, and also a memory device that achieves high operating speed and size and cost reductions.

According to a first aspect of the present invention, a memory device includes a plurality of memory cells for storing information. The plurality of memory cells are divided into a plurality of local blocks. The plurality of local blocks each contain the same number of memory cells.

In the memory device, in writing of the information to one of the memory cells, or in reading of the information from one of the memory cells, one of the plurality of local blocks is specified, and one of the same number of memory cells is specified in each local block in a common manner, and thereby only one memory cell in one local block is activated.

In writing or reading, one of the plurality of local blocks is specified, and one of the same number of memory cells is specified in each local block in a common manner, and thereby only a single memory cell in a single local block is activated. Thus unselected other memory cells are not activated, thereby providing a memory device that consumes no wasteful power when selecting memory cells.

According to a second aspect of the present invention, a memory device has a plurality of memory cells for storing information. The plurality of memory cells are divided into a plurality of local blocks. The plurality of local blocks are arranged in a plurality of lines in a first direction and are arranged in a plurality of lines in a second direction that is different from the first direction.

The memory device further includes a plurality of local read bit lines, a global read bit line, and a write bit line.

The local read bit line is provided in each of the plurality of local blocks and connected in common to all memory cells within that local block.

The global read bit line extends along the first direction, and is selectively connected to one of a plurality of the local read bit lines through a branch line extending along the second direction in read operation.

The write bit line extends along the first direction and connected to all of the plurality of memory cells through branch lines extending along the second direction.

The plurality of local blocks are arranged in the first and second directions, a plurality in each direction. Therefore both bit lines can be shorter than in an arrangement in which all local blocks are arranged in a line in the first direction and the global read bit line and the write bit line are extended in the first direction. This achieves higher speed signal transmission on both bit lines. Furthermore, according to the invention, the read bit lines include local and global lines and the write bit line is connected to all memory cells in common. It is necessary to drive the read bit line in the individual memory cells, and the load capacitance to the bit line can be reduced by adopting the local read bit lines, which increases the signal transmission speed. On the other hand, the write bit line is driven with a buffer having a large driving capability to withstand the load capacitance of all memory cells connected in common. This eliminates the need to provide a local write bit line and a driving buffer in each local block, thus preventing an increase in circuit scale. Moreover, according to the invention, a plurality of local blocks are arranged not only in the first direction but also in the second direction and the global read bit line and the write bit line are respectively connected to the local read bit lines and the memory cells through branch lines extending along the second direction. Accordingly, as compared with an arrangement in which memory devices are simply arranged in a plurality of lines, with each memory device having a plurality of local blocks all arranged in a line along the first direction and the global read bit line and write bit line extending along the first direction, the bit lines can be shared to reduce the number of interconnections. This reduces interconnection capacitance between bit lines and speeds up signal transmission.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

This preferred embodiment shows a memory device in which, in write or read operation, one of a plurality of local blocks is specified and one of the same number of memory cells is specified in each local block in a common manner, and thereby only a single memory cell in a single local block is activated. Since unselected other memory cells are not activated, the memory device does not wastefully consume power when selecting memory cells.

Figure 1:
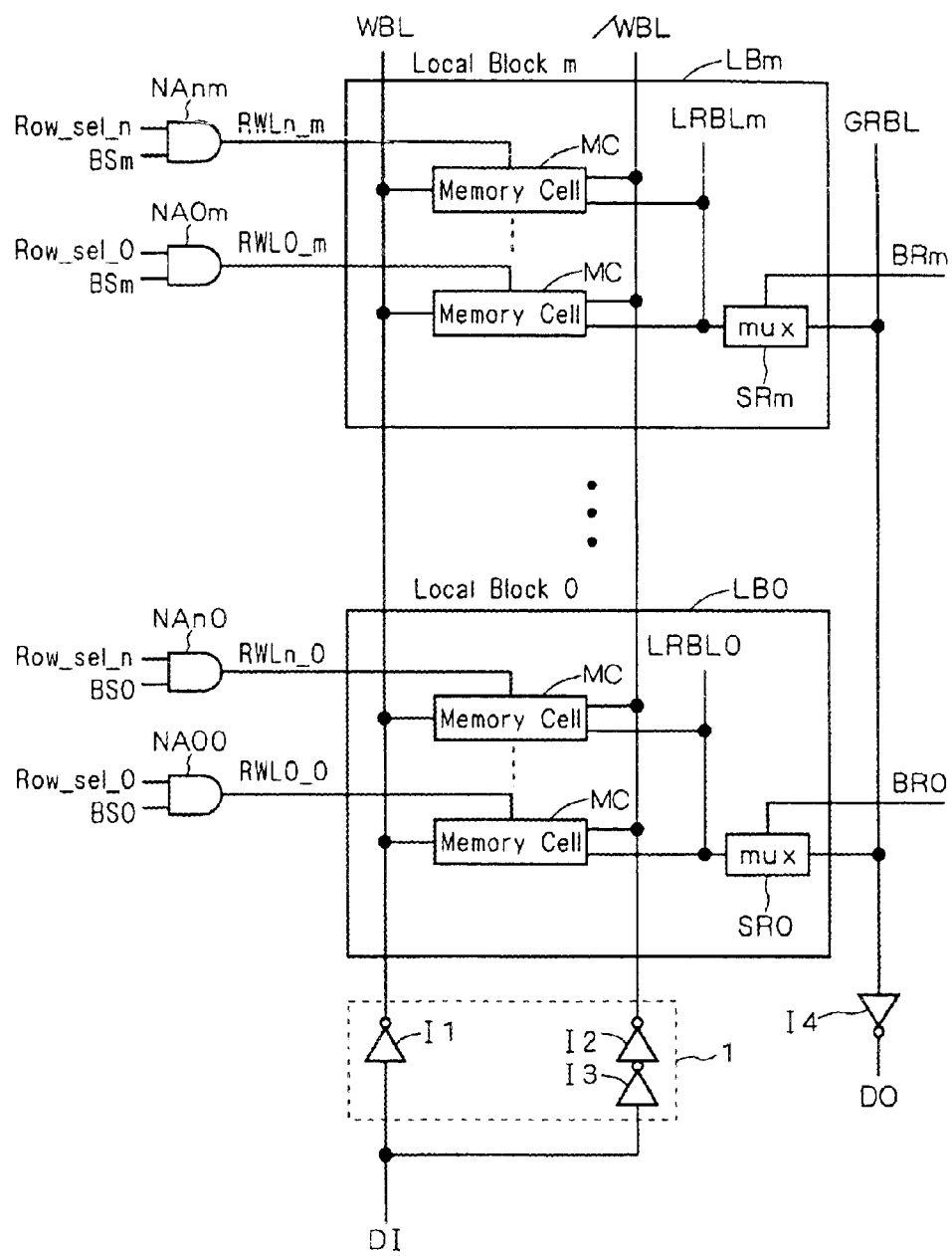
FIG. 1 is a diagram showing a memory device according to a first preferred embodiment.
Figure 5:
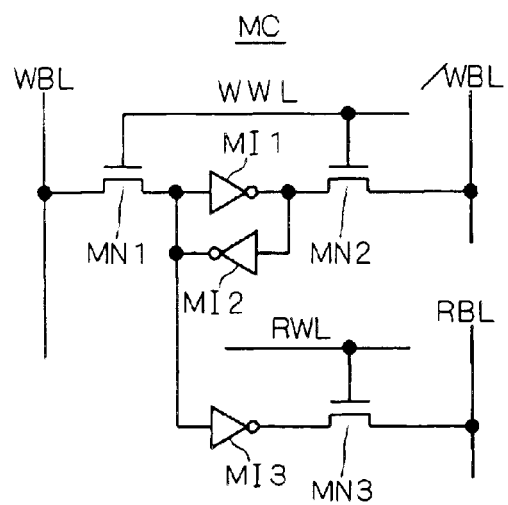
FIG. 5 is a diagram showing the circuit structure of the SRAM memory cell.

FIG. 1 is a diagram showing a memory device of this preferred embodiment. In this memory device, as shown in FIG. 1, local blocks LB0 to LBm (m is a positive number) each including the same number of memory cells MC (n+1 memory cells MC from 0th to nth: n is a positive number) are successively arranged in a line, as in the memory device of FIG. 6. For example, each memory cell MC forms an SRAM circuit that includes the inverters MI1 to MI3 and N-channel MOS transistors MN1 to MN3 as shown in FIG. 5.

Figure 6:
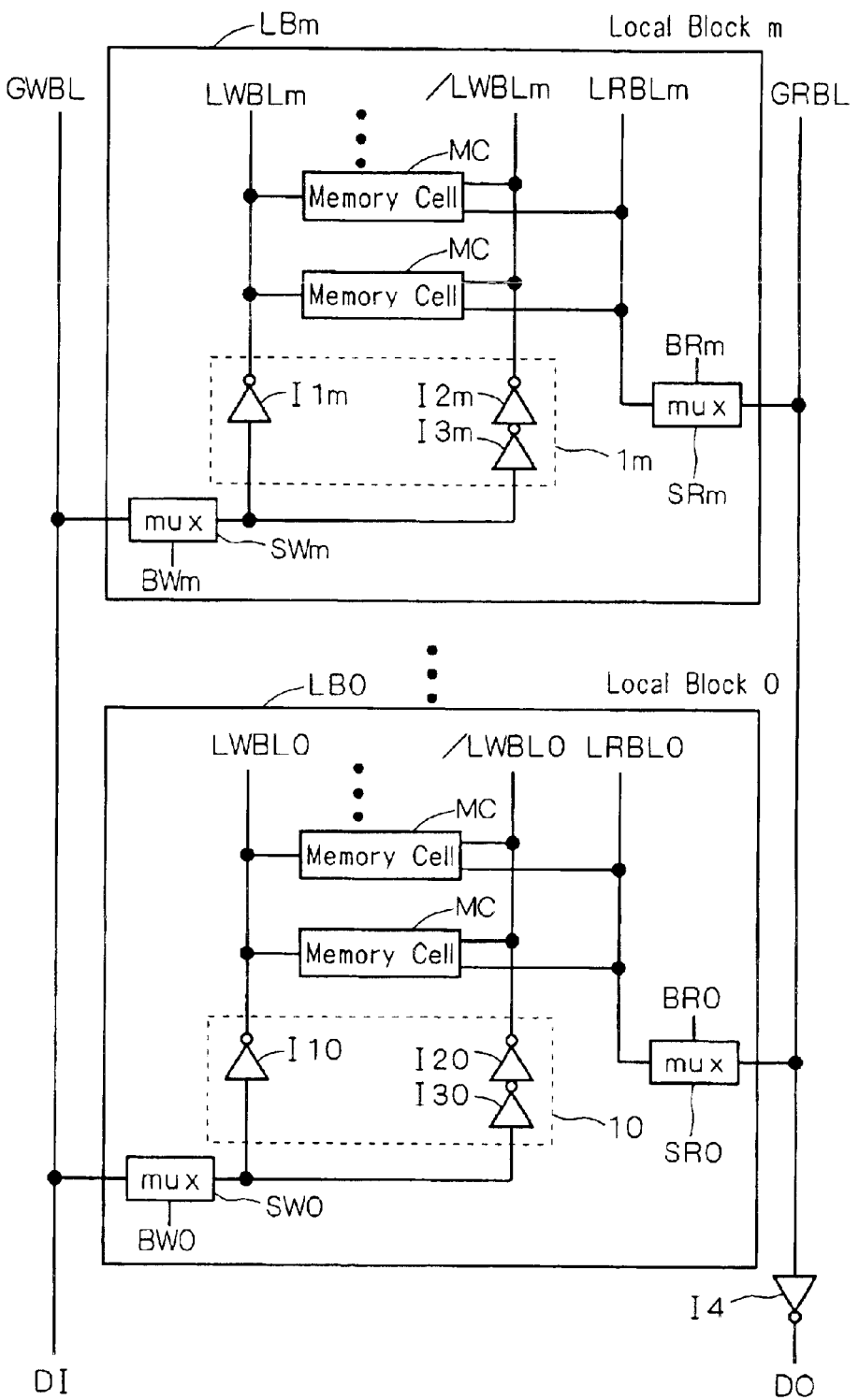
FIG. 6 is a diagram showing an example of structure of a conventional SRAM memory array that is divided into blocks.

Then, as in the memory device of FIG. 6, a global read bit line GRBL is connected to the local blocks LB0 to LBm in common. In each of the local blocks LB0 to LBm, a plurality of memory cells MC are successively arranged in a line. In the mth block, each memory cell MC is connected to a local read bit line LRBLm in common.

The local read bit line LRBLm is connected to the global read bit line GRBL through a read selector SRm. The read selector SRm, like that in the memory device of FIG. 6, is a switch circuit for giving stored data from a proper block to the global read bit line GRBL. For example, as mentioned earlier, the read selector SRm is formed as an AND circuit whose one input end is connected to the local read bit line LRBLm and whose other input end receives a read block select signal BRm. While the structure of the mth block has been described, the 0th and other blocks are constructed in the same way.

Figure 4:
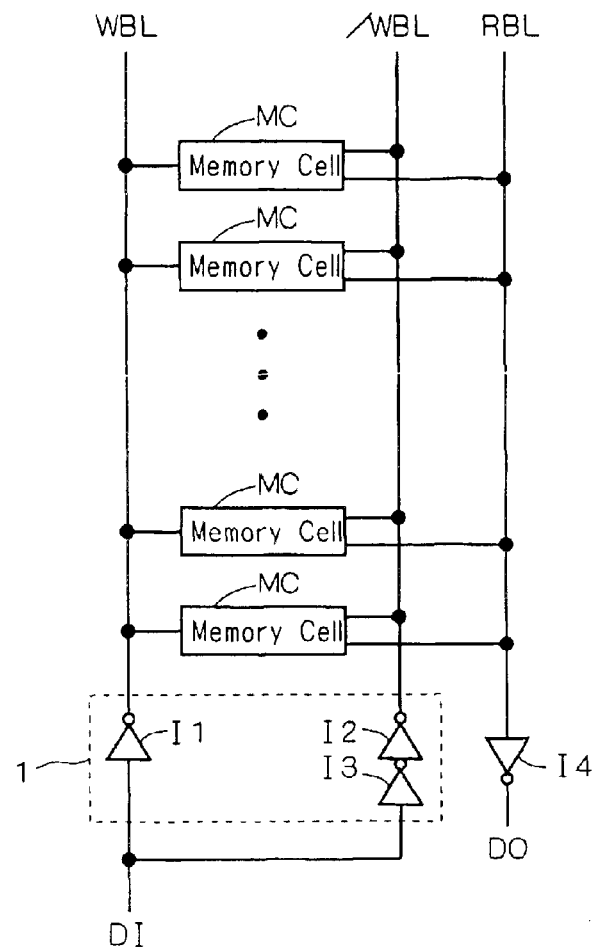
FIG. 4 is a diagram showing the structure of an SRAM memory array as an example of a conventional memory device.

In this preferred embodiment, as in the memory device of FIG. 4, the write bit line WBL and the inverted data write bit line /WBL are connected to all memory cells in common without dividing into local and global bit lines. In other words, a single write bit line WBL and a single inverted data write bit line /WBL are connected to all memory cells MC.

All memory cells MC are disposed between the write bit line WBL, and the inverted data write bit line /WBL and global read bit line GRBL. In other words, the local blocks LB0 to LBm are interposed between the write bit line WBL, and the inverted data write bit line /WBL and global read bit line GRBL.

Input data DI is provided to the write bit line WBL and the inverted data write bit line /WBL through a write driver 1 for driving both write bit lines. More specifically, the input data DI is given to the write bit line WBL through an inverter I1 in the write driver 1. Also, the input data DI is given to the inverted data write bit line /WBL through a series connection of inverters I2 and I3 in the write driver 1.

On the other hand, output data DO is provided as output from the global read bit line GRBL through an inverter I4 as a read driver for driving data output line.

In this preferred embodiment, the read bit lines divide into local and global lines and the write bit lines are connected in common to all memory cells.

The read bit line has to be driven by the N-channel MOS transistors MN3 in the individual memory cells MC, and the load capacitance to the bit line can be reduced by adopting the local read bit line LRBLm, which speeds up signal transmission.

On the other hand, the write bit lines are driven by buffers having large driving capability (i.e. the inverters I1 to I3 in the driver 1) to withstand the load capacitance of all memory cells MC connected in common. This eliminates the need to provide local write bit lines and driving buffers in each local block, thus avoiding an increase in circuit scale.

In addition to the lines described above, read word lines RWL0_0 to RWLn_0 , . . . RWL0_m to RWLn_m and write word lines are also connected to the memory cells MC (FIG. 1 does not show the write word lines).

In this preferred embodiment, in reading of information from a memory cell MC, one of the local blocks LB0 to LBm is specified and one of the memory cells MC is specified in each of the local blocks LB0 to LBm in a common manner. They are specified through the read word lines RWL0_0 to RWLn_0, . . . RWL0_m to RWLn_m. Thus only a single memory cell in a single local block is activated.

Specifically, AND circuits NA00 to NAn0, . . . NA0m to NAnm are provided in correspondence with all memory cells MC in the memory device. Then block select signals (binary signals) BS0 to BSm, each for selecting one of the local blocks LB0 to LBm, are applied to first input ends of the corresponding AND circuits NA00 to NAn0, . . . NA0m to NAnm. More specifically, for example, a block select signal BSm for selecting the local block LBm is applied in common to the first input ends of all of the AND circuits NA0m to NAnm that correspond to the memory cells MC in the local block LBm.

Similarly, in-block memory cell select signals (binary signals) Row_sel_0 to Row_sel_n, each for selecting one of the memory cells MC in each local block in a common manner among the local blocks LB0 to LBm, are applied to the second input ends of the corresponding AND circuits NA00 to NAn0, ... NA0m to NAnm. More specifically, for example, an in-block memory cell select signal Row_sel_0 for selecting the first-row memory cell is given in common to the second input ends of all of the AND circuits NA00, NA01, ... NA0m that correspond to the first-row memory cells MC in the local blocks LB0 to LBm (i.e. lowest memory cells MC in respective local blocks).

Then each of the AND circuits NA00 to NAn0, ... NA0m to NAnm operates logical AND of the two input signals. Then the outputs from the AND circuits NA00 to NAn0, ... NA0m to NAnm are respectively applied to the read word lines RWL0_0 to RWLn_0, ... RWL0_m to RWLn_m and transmitted to the gates of the N-channel MOS transistors NM3 in the memory cells MC.

Thus, one of the local blocks LB0 to LBm is specified and one of the memory cells MC in each local block is specified, and only a single memory cell in a single local block is activated.

Thus, a memory device in which only a single memory cell in one local block is activated can be easily obtained by simply providing the AND circuits for the individual memory cells MC. Other unselected memory cells are not activated and no current flows to the local read bit lines from these memory cells.

This provides a memory device that consumes no wasteful power when selecting memory cells.

This preferred embodiment has shown a structure in which the outputs from the AND circuits NA00 to NAn0, ... NA0m to NAnm are respectively applied to the read word lines RWL0_0 to RWLn_0, ... RWL0_m to RWLn_m; however, for example, the outputs from the AND circuits NA00 to NAn0, ... NA0m to NAnm may be applied to the write word lines (not shown in FIG. 1) in the individual memory cells. Applying this structure to, e.g. the memory device of FIG. 6 provides a memory device that has the effect of reducing power consumption in writing.

<Second Preferred Embodiment>

This preferred embodiment shows a modification of the memory device of the first preferred embodiment, where latch circuits, each including two inverters each having its input connected to the other's output, are provided in correspondence with the local read bit lines LRB0 to LRBLm; the latch circuits are positioned to precede the respective read selectors SR0 to SRm.

Figure 2:
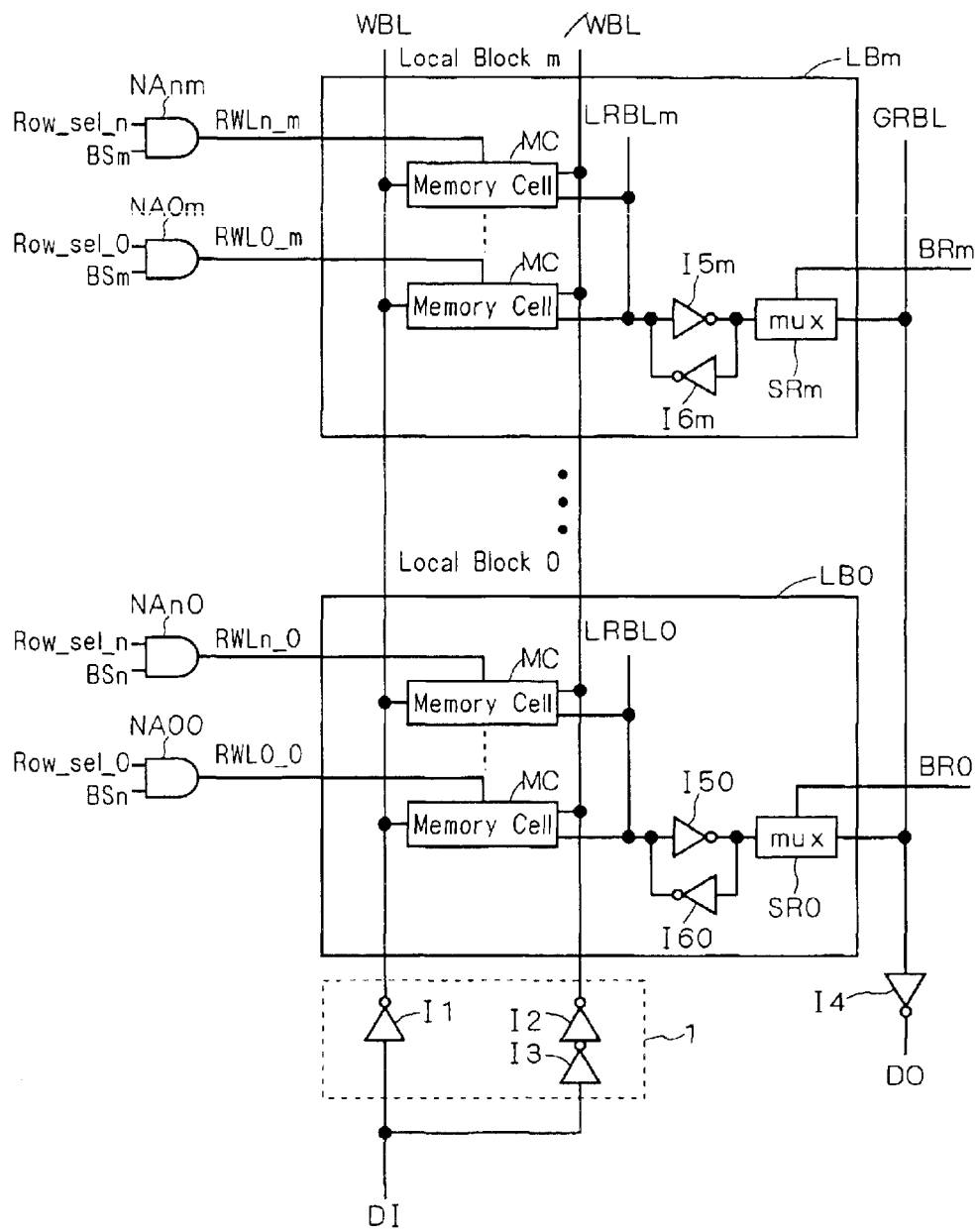
FIG. 2 is a diagram showing a memory device according to a second preferred embodiment.

FIG. 2 is a diagram showing a memory device of this preferred embodiment. This memory device, as shown in FIG. 2, differs from the memory device of the first preferred embodiment in that the local block LBm, for example, further includes a latch circuit which has inverters I5m and I6m each having its input connected to the other's output; the latch circuit is disposed at the end of the local read bit line LRBLm and precedes the read selector SRm. Other local blocks are also provided with the same latch circuits.

In read operation, the global read bit line GRBL is selectively connected through the latch circuit to one of the plurality of local read bit lines LRBL0 to LRBLm.

In other respects the structure is the same as that of the memory device of the first preferred embodiment and therefore not described again.

In the memory device of the first preferred embodiment, unselected memory cells are not activated, so the potential of the local read bit lines is placed in a floating state.

Now, it may be suggested that a buffer is provided to each local read bit line for signal amplification (for example, in FIG. 2, only the inverters I50 to I5m are provided and used as buffers for signal amplification, without the inverters I60 to I6m). However, when the potential of the local read bit line is placed in a floating state, a through current may flow in the buffer provided to the local read bit line (i.e. a current flowing through NMOS and PMOS in CMOS (Complementary MOS) forming the inverters I50 to I5m).

According to the memory device of this preferred embodiment, latch circuits are provided in correspondence with the local read bit lines. Then the potential of the local read bit lines is fixed at Hi or Low instead of being placed in a floating state, which is advantageous in that, even when buffers are provided to the local read bit lines for signal amplification, no through current flows in the buffers.

<Third Preferred Embodiment>

This preferred embodiment, also, shows a modification of the memory device of the first preferred embodiment, where a plurality of local blocks are arranged in a plurality of lines in a first direction and also are arranged in a plurality of lines in a second direction different from the first direction.

Figure 3:
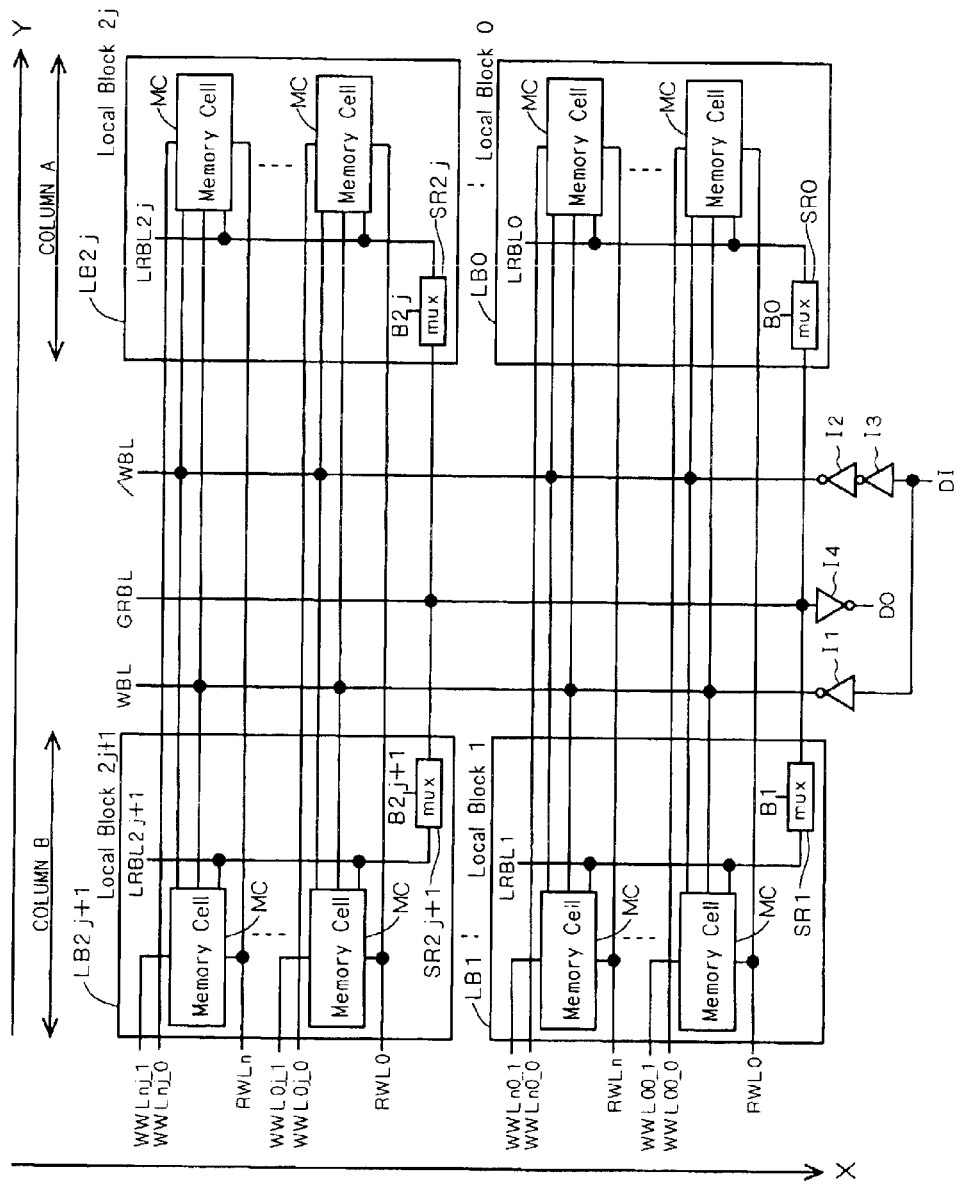
FIG. 3 is a diagram showing a memory device according to a third preferred embodiment.

FIG. 3 is a diagram showing a memory device of this preferred embodiment. As shown in FIG. 3, this memory device includes 2j+2 local blocks LB0 to LB2j+1 (j is a positive number); a plurality of local blocks are arranged in a plurality of lines in the direction X and are arranged in a plurality of lines in the direction Y perpendicular to the direction X. More specifically, the local blocks are arranged in two columns disposed side by side in the direction Y, where local blocks denoted by even numbers after LB are arranged in the right column (column A) in FIG. 3, and local blocks denoted by odd numbers are arranged in the left column (column B) in FIG. 3.

The global read bit line GRBL, the write bit line WBL, and the inverted data write bit line /WBL are disposed between the two columns of local blocks. The global read bit line GRBL, the write bit line WBL, and the inverted data write bit line /WBL all extend along the direction X, and the global read bit line GRBL is connected to the local read bit lines LRBL0 to LRBL2j+1 respectively via read selectors SR0 to SR2j+1 through a plurality of branch lines extending along the direction Y. The write bit line WBL and the inverted data write bit line /WBL are connected to all memory cells through a plurality of branch lines extending along the direction Y.

In this preferred embodiment, the AND circuits NA00 to NAn0, ... NA0m to NAnm shown in the first preferred embodiment are absent; instead, read word lines RWL0 to RWLn are connected to the memory cells MC in the local blocks in both columns A and B in common.

In this preferred embodiment, write word lines WWL00_0 to WWLn0_0, ... WWL0j_0 to WWLnj_0 are connected to the local blocks in the column A. Also, similarly, write word lines WWL00_1 to WWLn0_1, ... WWL0j_1 to WWLnj_1 are connected to the local blocks in the column B.

In other respects the structure is the same as the memory device of the first preferred embodiment and therefore not described again here.

Thus, arranging a plurality of local blocks in each of the directions X and Y allows all bit lines to be shorter than when all local blocks are arranged in a line, e.g. in the direction X, with the global read bit line GRBL, write bit line WBL and inverted data write bit line /WBL extending along the direction X. This speeds up signal transmission on each bit line.

In the memory device of this preferred embodiment, the read bit lines include local and global lines and the write bit lines are connected in common to all memory cells.

The read bit line has to be driven in each memory cell MC, and the load capacitance to the bit line can be reduced by adopting the local read bit lines LRBL0 to LRBL2j+1, which speeds up signal transmission.

On the other hand, the write bit line WBL and the inverted data write bit line /WBL are driven with buffers I1 to I3 having a large driving capability to withstand the load capacitance of all memory cells connected in common. This eliminates to provide local write bit lines and driving buffers in each local block, thereby avoiding an increase in circuit scale.

Also, in the memory device of this preferred embodiment, a plurality of local blocks are arranged not only in the direction X but also in the direction Y and the global read bit line GRBL, and the write bit line WBL and inverted data write bit line /WBL are respectively connected to the local read bit lines LRBL0 to LRBL2j+1 and to the memory cells MC through branch lines extending along the direction Y.

Therefore, as compared with an arrangement in which memory devices are simply arranged in a plurality of parallel columns, with each memory device having local blocks all arranged in a line along the direction X, and the global read bit line GRBL, write bit line WBL, and inverted data write bit line /WBL extending along the direction X, the bit lines can be shared among local blocks for reducing the number of lines in the direction Y. This reduces interconnection capacitance between bit lines and increases the signal transmission speed.

While the invention has been described in detail, the foregoing description is in all aspects illustrative and not restrictive. It is understood that numerous other modifications and variations can be devised without departing from the scope of the invention.

What is claimed is:

1. A memory device comprising:

a plurality of memory cells for storing information, said plurality of memory cells divided into a plurality of local blocks, and said plurality of local blocks each including a same number of said memory cells; and a plurality of AND circuits provided in correspondence with said plurality of memory cells, wherein, in writing of said information to one of said memory cells, or in reading of said information from one of said memory cells, one of said plurality of local blocks is specified, and one of the same number of memory cells is specified in each said local block in a common manner, and thereby only said one memory cell in said one local block is activated, and one of said plurality of local blocks and one of said same number of said memory cells are specified by generating a block select signal for selecting one of said plurality of local blocks and an in-block memory cell select signal for selecting one of said same number of memory cells in a common manner among said plurality of local blocks, and logically operating said two select signals in each of said plurality of corresponding AND circuits.

2. The memory device according to claim 1, further comprising:

a local read bit line provided in each of said plurality of local blocks and connected in common to all said memory cells within said local block;

a plurality of latch circuits provided respectively for said plurality of local read bit lines and connected respectively to said corresponding local read bit lines; and a global read bit line which, in read operation, is selectively connected to one of said plurality of local read bit lines through said latch circuit.

3. The memory device according to claim 2, wherein each said latch circuit comprises first and second inverters each having an input and an output, and said first and second inverters each have said input connected to said output of the other.

4. A memory device comprising:

a plurality of memory cells for storing information, said plurality of memory cells divided into a plurality of local blocks, and said plurality of local blocks each including a same number of said memory cells;

a local read bit line provided in each of said plurality of local blocks and connected in common to all said memory cells within said local block;

a plurality of latch circuits provided respectively for said plurality of local read bit lines and connected respectively to said corresponding local read bit lines; and a global read bit line which, in read operation, is selectively connected to one of said plurality of local read bit lines through said latch circuit, wherein, in writing of said information to one of said memory cells, or in reading of said information from one of said memory cells, one of said plurality of local blocks is specified, and one of the same number of memory cells is specified in each said local block in a common manner, and thereby only said one memory cell in said one local block is activated, each said latch circuit comprises first and second inverters each having an input and an output, and said first and second inverters each have said input connected to said output of the other.

* * * * *